(12) United States Patent
Kerr et al.

(10) Patent No.: US 7,713,811 B2
(45) Date of Patent: May 11, 2010

(54) MULTIPLE DOPING LEVEL BIPOLAR JUNCTIONS TRANSISTORS AND METHOD FOR FORMING

(75) Inventors: Daniel Charles Kerr, Orlando, FL (US); Michael Scott Carroll, Orlando, FL (US); Amal Ma Hamad, Frisco, TX (US); Thiet The Lai, Orlando, FL (US); Roger W. Key, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 30 days.

(21) Appl. No.: 12/243,137

(22) Filed: Oct. 1, 2008

(65) Prior Publication Data

US 2009/0029510 A1      Jan. 29, 2009

Related U.S. Application Data

(62) Division of application No. 11/458,270, filed on Jul. 18, 2006, now Pat. No. 7,449,388, which is a division of application No. 10/953,894, filed on Sep. 29, 2004, now Pat. No. 7,095,094.

(51) Int. Cl.
    *H01L 21/8249* (2006.01)

(52) U.S. Cl. .............................. 438/235; 257/E33.016

(58) Field of Classification Search .................. 438/235, 438/243; 257/E29.14, E29.188, E29.315, 257/E33.027, E33.021, E33.016
See application file for complete search history.

(56) References Cited

U.S. PATENT DOCUMENTS

| | | | |
|---|---|---|---|
| 4,881,105 A | 11/1989 | Davari et al. | |
| 5,079,613 A | 1/1992 | Sawada et al. | |
| 5,497,023 A * | 3/1996 | Nakazato et al. | 257/394 |
| 5,990,535 A | 11/1999 | Palara | |
| 6,266,222 B1 | 7/2001 | Colombo et al. | |
| 6,285,240 B1 | 9/2001 | Shiau et al. | |
| 6,525,394 B1 | 2/2003 | Kuhn et al. | |
| 6,586,297 B1 * | 7/2003 | U'Ren et al. | 438/235 |
| 6,600,186 B1 | 7/2003 | Lee et al. | |
| 6,746,928 B1 * | 6/2004 | Schuegraf et al. | 438/314 |
| 6,831,334 B2 | 12/2004 | Okawa et al. | |
| 7,095,094 B2 | 8/2006 | Kerr et al. | |
| 2004/0164354 A1 | 8/2004 | Mergens et al. | |
| 2006/0065936 A1 | 3/2006 | Kerr et al. | |
| 2006/0252215 A1 | 11/2006 | Kerr et al. | |

* cited by examiner

*Primary Examiner*—Thao P. Le

(57) ABSTRACT

A process for forming bipolar junction transistors having a plurality of different collector doping densities on a semiconductor substrate and an integrated circuit comprising bipolar junction transistors having a plurality of different collector doping densities. A first group of the transistors are formed during formation of a triple well for use in providing triple well isolation for complementary metal oxide semiconductor field effect transistors also formed on the semiconductor substrate. Additional bipolar junction transistors with different collector doping densities are formed during a second doping step after forming a gate stack for the field effect transistors. Implant doping through bipolar transistor emitter windows forms bipolar transistors having different doping densities than the previously formed bipolar transistors. According to one embodiment of the present invention, bipolar junction transistors having six different collector dopant densities (and thus six different breakdown characteristics) are formed.

7 Claims, 13 Drawing Sheets

MULTIPLE DOPING LEVEL BIPOLAR JUNCTIONS TRANSISTORS AND METHOD FOR FORMING

CROSS-REFERENCE TO RELATED APPLICATION

This application is a Divisional of prior application Ser. No. 11/458,270 filed on Jul. 18, 2006, now U.S. Pat. No. 7,449,388, entitled "MULTIPLE DOPING LEVEL BIPOLAR JUNCTIONS TRANSISTORS AND METHOD FOR FORMING," to Daniel Charles Kerr, et al. currently allowed, which is a Divisional of U.S. Pat. No. 7,095,094 issued on Aug. 22, 2006 (Ser. No. 10/953,894 filed on Sep. 29, 2004), entitled "MULTIPLE DOPING LEVEL BIPOLAR JUNCTIONS TRANSISTORS AND METHOD FOR FORMING," to Daniel Charles Kerr, et al. The above-listed applications are commonly assigned with the present invention and incorporated herein by reference.

FIELD OF THE INVENTION

The present invention relates generally to bipolar junction transistors and more specifically to a process for forming bipolar junction transistors having different collector doping levels and to transistors formed according to the process.

BACKGROUND OF THE INVENTION

A bipolar junction transistor (BJT) comprises three adjacent doped semiconductor regions or layers having an NPN or PNP doping configuration. A middle region forms a base and two end regions form an emitter and a collector. Typically, the emitter has a higher dopant concentration than the base and the collector, and the base has a higher dopant concentration than the collector. Generally, the BJT can be operated as an amplifier (for example, to amplify an input signal supplied between the base and the emitter, with the output signal appearing across the emitter/collector) or as a switch (for example, an input signal applied across the base/emitter switches the emitter/collector circuit to an opened or a closed (i.e., short-circuited) state. In operation, the emitter/base pn junction is forward biased and the collector/base pn junction is reverse biased.

There are several known semiconductor fabrication processes for forming the three doped layers of a bipolar junction transistor and several transistor architectures can be formed according to such processes. The simplest structure is a planar architecture with the stacked NPN or PNP regions formed by successive dopant implants into a semiconductor substrate.

A metal-oxide field effect transistor (MOSFET) differs in structure and operation from a BJT. The MOSFET comprises source and drain doped regions formed in a tub or well having an opposite doping type. A voltage applied to a gate disposed above the well between the source and drain inverts the conductivity of a channel region between the source and the drain, permitting current flow through the channel.

In certain MOSFET devices it may be desired to bias a p-doped tub of an NMOSFET separately from the substrate in which the tub is formed. This bias arrangement requires complete isolation of the entire p-tub from the substrate. One common isolation technique comprises junction isolation, for example, a triple well process wherein an implant step dopes n-type a region of the silicon substrate immediately below the p-tub. A subsequent n-type tub implant forms a ring of n-type material around the periphery of the p-tub, extending downwardly to connect with the n-type triple well to isolate the p-tub from the substrate. The triple well and tub implant steps are performed prior to forming the MOSFET gate and its associated components.

Most integrated circuits for processing digital signals comprise a plurality of complimentary metal-oxide semiconductor field effect transistors (CMOSFETS) each of which further comprises an arrangement of an NMOSFET formed in a p-type substrate well and a PMOSFET formed in an n-type well. Certain of these integrated circuits also include bipolar junction transistors and thus are referred to as BiCMOS circuits. CMOS devices consume less power and occupy less integrated circuit area than the BJT. However, BJT's generally exhibit a higher switching speed.

It is known that there is a maximum reverse voltage that can be applied across any two junctions of the BJT before the junction breaks down. Break down current flow through the reverse-biased junction can generate excess heat and may destroy the junction and thus the transistor. The breakdown voltage of a pn junction decreases as the doping level on either or both sides of the junction increases. Thus, to increase the breakdown voltage the doping level on one or both sides of the junction is reduced. The lower dopant density lowers the electric field intensity across the junction for a fixed applied voltage, or stated differently, raises the voltage at which junction breakdown occurs. However, there are known disadvantages to low-doped junctions, including a higher junction resistance and slower switching speed or response time to an input signal.

The two BJT breakdown characteristics of interest are $BV_{CEO}$ (collector-emitter breakdown voltage with the base open circuited) and $BV_{CBO}$ (collector-base junction breakdown voltage with the emitter open circuited). Since the collector current injected into the base region is multiplied by the transistor gain ($\beta$), these two breakdown characteristics are related by $$BV_{CEO}/BV_{CBO} \approx (1/\beta)^{1/m}$$

where m is between about 3 and 6.

Cost considerations constrain BiCMOS fabricators to offer one or at most two BJT breakdown classes or types in an integrated circuit, i.e., a first type exhibiting a relatively high breakdown voltage (i.e., $BV_{CEO}$ and $BV_{CBO}$) and a second type exhibiting a relatively low breakdown voltage. To form two BJT from each class in an integrated circuit, a first mask is employed to expose certain collector regions where a first dopant concentration is implanted using an ion dose with a first implant energy. A second mask exposes other collector regions for receiving a second implant ion dose at a second implant energy to form a second dopant concentration. Offering bipolar transistors with other (e.g., intermediate) breakdown voltages provides the circuit designer with additional design flexibility, but requires developing another mask and adding additional implant and mask process steps, thereby increasing fabrication costs. Thus providing additional transistor breakdown classes may not be justified by the extra cost of the masking and implant steps.

Recognizing these cost limitations, during integrated circuit design, BJT breakdown characteristics are selected based on perceived customer needs, and circuit designers are restricted to the selected BJT breakdown classes fabricated in the integrated circuit. This "one size fits all" compromise approach can cause difficulties in implementing a circuit with desired operational characteristics when the designer is restricted to only two breakdown values for the BJT's on the integrated circuit. It is thus desired to expand the number of NPN breakdown classes without increasing the fabrication cost.

Each integrated circuit foundry employs specific fabrication process parameters that are unique to the foundry, e.g., wafer routing, process checks, process recipes, process documentation, test conditions and specification limits. As a result, difficulties may be encountered in transferring fabrication of an integrated circuit product (including a BJT) from one foundry to another, as the receiving foundry may not possess the capability to manufacture the integrated circuit. To successfully transfer the product, the receiving foundry must match the process parameters of the transferring foundry, which can be a difficult and costly undertaking.

As related to fabrication of BJT's with different breakdown voltages, each foundry typically individually optimizes its NPN voltage breakdown offerings. Thus it is difficult to transfer a BJT product from one foundry to another. A foundry capable of producing several different BJT breakdown types is more likely to successfully fabricate a BiCMOS integrated circuit transferred from another fabrication foundry.

BRIEF SUMMARY OF THE INVENTION

A process according to the present invention comprises forming a bipolar junction transistor in a semiconductor substrate The process comprises forming a first doped tub region of a first dopant type within the substrate, forming a doped sinker region of a second dopant type within the substrate and forming second and third doped tub regions of the second dopant type in the substrate. A subcollector region and a triple well region both of the second dopant type are formed concurrently. The triple well region and the second and the third doped tub regions cooperate to electrically isolate the first doped tub region from the substrate. The subcollector region cooperates with the doped sinker region.

An apparatus according to the present invention comprises a semiconductor integrated circuit further comprising a plurality of bipolar junction transistors disposed in a semiconductor substrate. The integrated circuit comprises a first subcollector region having a first doping level; (TW) a second subcollector region having a second doping level; (NPN) a third subcollector region having a third doping level; (TW+NPN) a fourth subcollector region having the first doping level and a portion thereof having a fourth doping level; (TW+SIC) a fifth subcollector region having the second doping level and a portion thereof having the fourth doping level; and (NPN+SIC) a sixth subcollector region having the third doping level and a portion thereof having the fourth doping level. (TW+NPN+SIC)

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
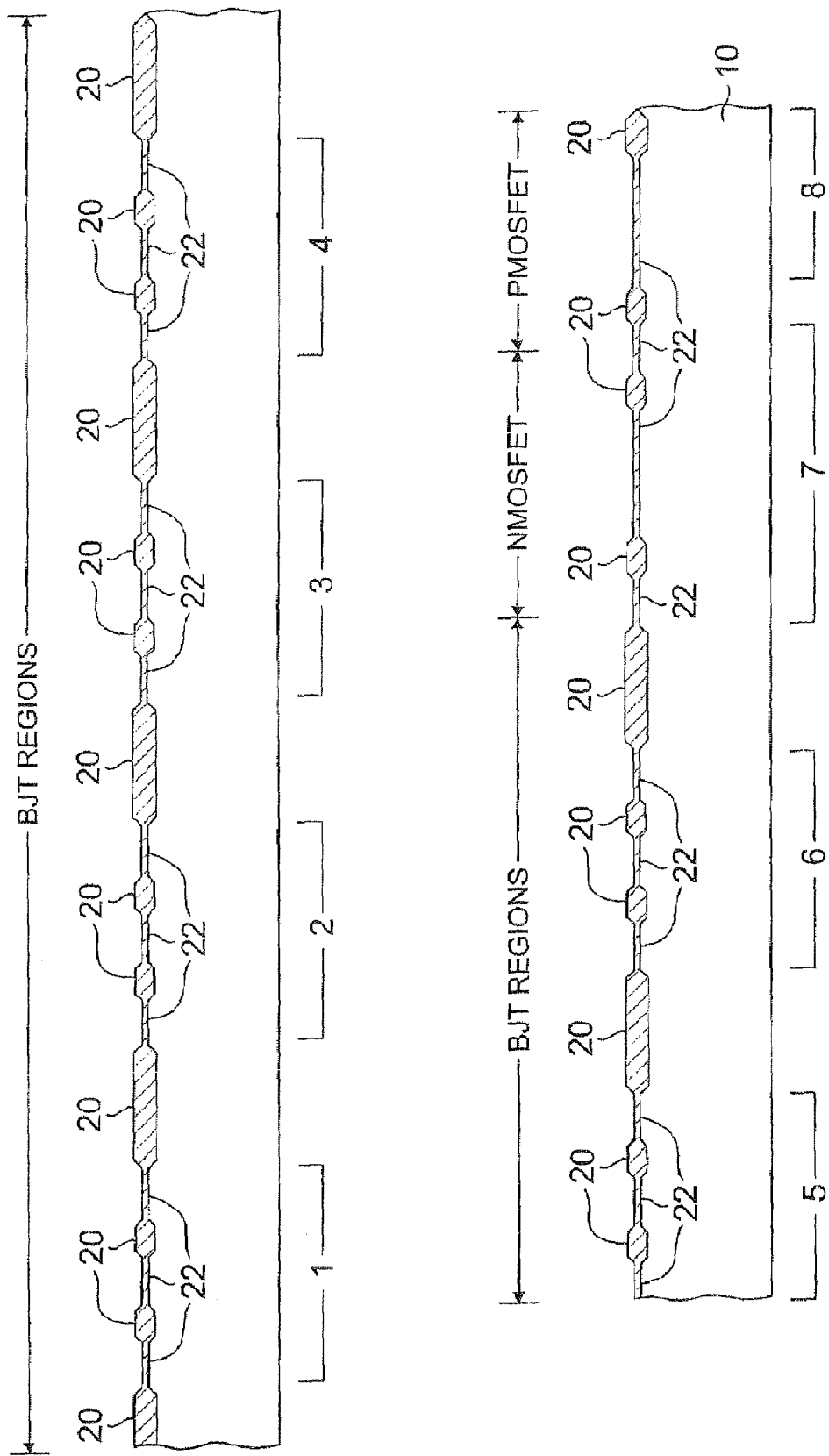
FIGS. 1-16 are cross-sectional illustrations of sequential processing steps for forming a bipolar junction transistor and metal-oxide semiconductor field effect transistors according to the present invention.

Before describing in detail the particular method and apparatus for forming a bipolar junction transistor on a semiconductor integrated circuit, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

FIGS. 1-16 show cross-sectional views of formed structures according to sequential process steps for forming more than two breakdown classes for NPN bipolar junction transistors. The number of breakdown classes is at least doubled over the prior art.

The illustrated process is a BiCMOS process wherein bipolar transistors and CMOS devices are formed on a single substrate. NPN BJT's are formed in BJT regions 1-6 of a substrate 10 of FIG. 1, with each BJT having a different breakdown voltage, e.g., $BV_{CEO}$ and $BV_{CBO}$, due to different collector doping densities. An NMOSFET is formed in an NMOSFET region 7 and a PMOSFET is formed in a PMOSFET region 8 of the substrate 10. Although the invention is described in the context of a BiCMOS fabrication process and BiCMOS devices, those skilled in the art recognize that the teachings of the present invention are not restricted to BiCMOS integrated circuit embodiments, but can be employed to fabricate BJT's in embodiments other than in combination with CMOS transistors.

The present invention teaches a process for forming several classes of BJT's and BJT structures formed according to the process, with each class having different breakdown characteristics. Although each class is represented by only one BJT in the following description and accompanying figures, this is merely exemplary as an integrated circuit typically comprises a plurality of BJT's in each breakdown class. Also, in certain embodiments all breakdown classes may not be present in the semiconductor integrated circuit.

To avoid performance degradation and electrical cross-talk between the devices of an integrated circuit, it is necessary to electrically isolate the BJT's and the CMOS devices. The illustrated exemplary process employs LOCOS (local oxidation of silicon) isolation. To form the LOCOS regions, the silicon substrate 10 is oxidized to form a silicon dioxide layer, also referred to as a pad oxide layer. A silicon nitride layer is deposited overlying the silicon dioxide layer. The silicon nitride layer and the silicon dioxide layer are etched to remove certain regions thereof according to an overlying patterned photoresist layer. The remaining regions of the silicon dioxide and silicon nitride layers serve as an oxidation mask during a LOCOS oxidation process, such that the isolation regions are formed in the substrate 10 only through the openings in the two layers. The LOCOS oxidation process forms isolation silicon dioxide regions 20 illustrated in FIG. 1.

It is known that in other embodiments, different isolation schemes can be used, such as shallow trench isolation alone or a combination of shallow and deep trench isolation.

After forming the isolation regions 20, the remaining regions of the silicon nitride and the silicon dioxide layers are removed and a sacrificial silicon dioxide layer 22 is formed over the substrate 10 in regions between adjacent isolation regions 20.

Next, a photoresist layer (not shown in FIG. 2) is deposited, masked, patterned and developed to form a p-tub photoresist implant mask. A p-type dopant is implanted through the mask to form a p-tub 27 in the NMOS region 7 of the substrate 10. The p-tub 27 as formed according to these process steps is illustrated in FIG. 2.

Figure 2:
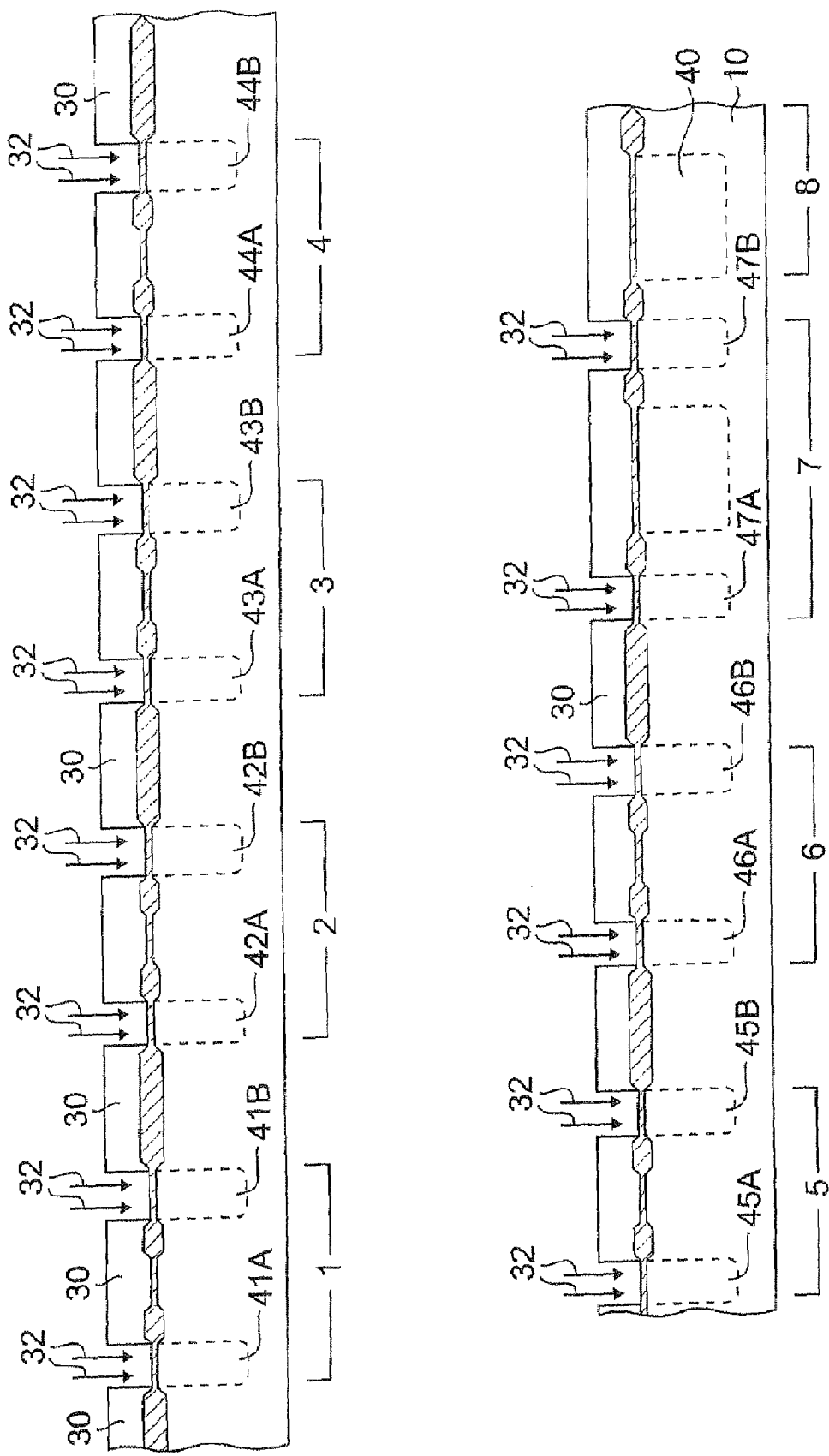

Continuing with FIG. 2, an n-tub photoresist implant mask 30 is formed and n-type dopants implanted through the mask, as indicated by implant arrowheads 32. The implant process forms an n-tub 40 in the PMOS region 8, n-tubs 41A and 41B in the BJT region 1, n-tubs 42A and 42B in the BJT region 2, n-tubs 43A and 43B in the BJT region 3, n-tubs 44A and 44B in the BJT region 4, n-tubs 45A and 45B in the BJT region 5, n-tubs 46A and 46B in the BJT region 6, and n-tubs 47A and 47B in NMOS region 7. The n-tubs associated with the BJT regions 1-6 operate as sinker regions for connecting to subsequently formed subcollectors, as described below.

Figure 3:
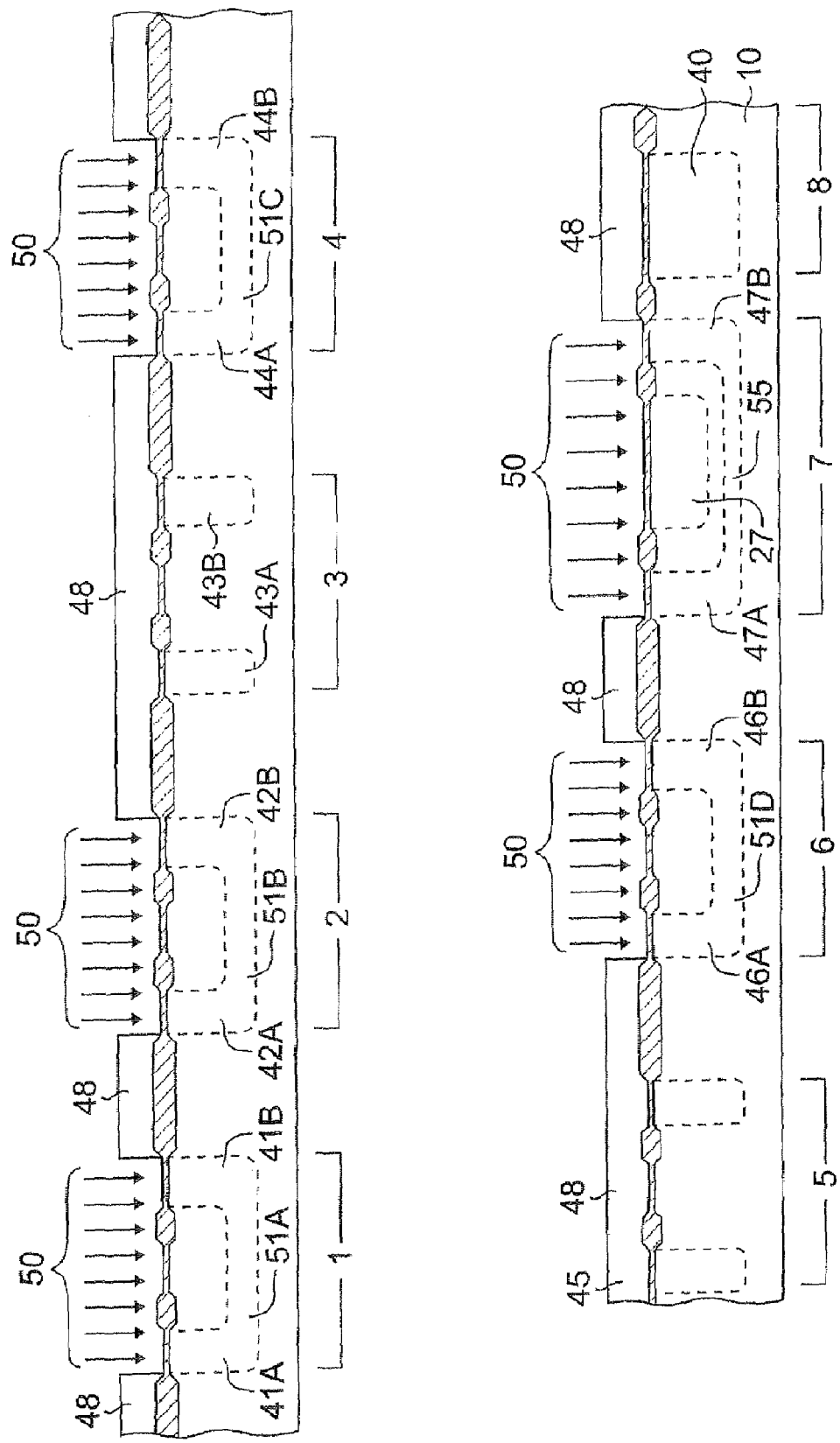

As illustrated in FIG. 3, a triple well mask 48 is formed over the substrate 10 and dopants implanted through the mask 48 as indicated by n-type dopant implant arrowheads 50, forming n-type subcollectors 51A-51D in the BJT regions, 1, 2, 4 and 6, respectively, and an n-type triple well region 55 below the p-tub 27. The subcollectors 51A-51D each have substantially the same dopant concentration and overlap with the respective n-tubs 41A/41B, 42A/42B, 44A/44B and 46A/46B as indicated to form a relatively contiguous doped region.

The implant step illustrated in FIG. 3, referred to as the triple well/subcollector implant, serves a dual purpose. In the NMOS region 7, the implant step forms a deep n-well region for a triple well process. Overlapping dopants in the triple well region 55 with the tubs 47A and 47B forms an n-type isolation tub around the p-tub or p-well 27. In the BJT regions, this triple well/subcollector dopant implant step forms subcollectors for low-breakdown BJT's as further described below.

According to prior art practice, formation of the subcollectors 51A-51D prior to process steps forming the gate of the MOSFET devices results in undesired dopant diffusion in the subcollectors during subsequent thermal cycles, including gate oxidation thermal cycling. The present inventors have determined that formation of the subcollectors 51A-51D prior to gate processing is an effective alternative to the prior art practice, and it has been determined that the BJT's formed according to this practice have desired performance characteristics. Also according to the prior art, the implant dose forming the BJT subcollector is about 20-50 times higher than the implant dose forming the triple well region 55. For example, the triple well process of the prior art employs an implant dose of about 2E13 per cubic cm and the BJT subcollector process of the prior art employs a dose of about 5E14 per cubic cm. According to the teachings of the present invention, the FIG. 3 triple well/subcollector implant process that forms both the triple well and the BJT subcollectors employs an implant dose of about 2E13 per cubic cm.

According to another prior art process, a high dose implant forms the BJT's, a blanket silicon epitaxial layer is formed and then the n-tub and the p-tub are formed by implant steps. The present invention differs from this practice by using the same process step to form both the BJT subcollectors and the triple well.

Figure 4:
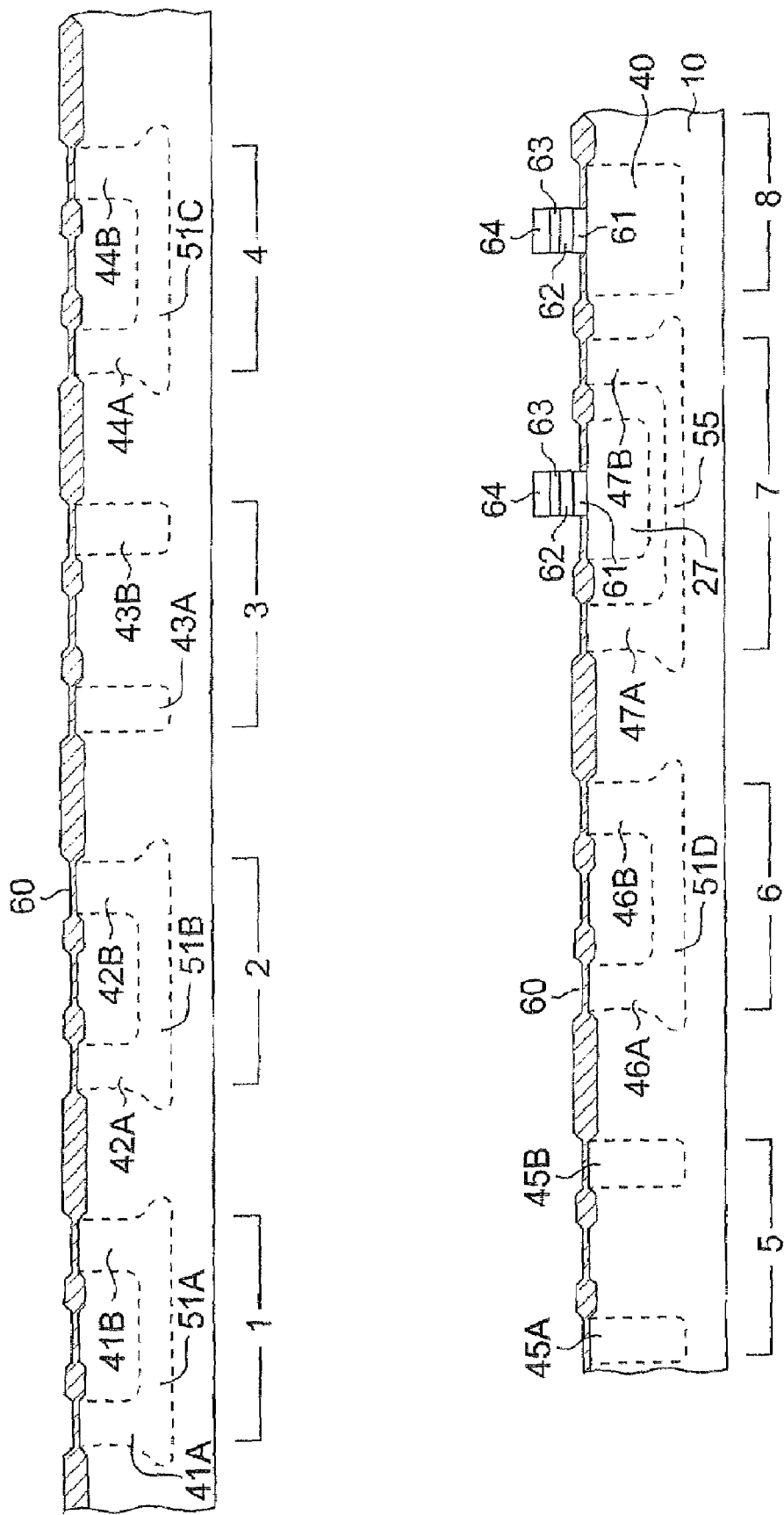

A CMOS gate stack for the PMOS and NMOS devices is formed next according to known techniques. In an exemplary process, a wet clean process removes the photoresist mask and the sacrificial silicon dioxide layer 22. Gate stack layers comprising a silicon dioxide layer, a polysilicon layer and a tungsten silicide layer are grown or blanket deposited on an upper surface 60 of the substrate 10. After doping the polysilicon layer through an implant mask, the gate stack layers are patterned, typically using an oxide hard mask. FIG. 4 illustrates the resulting stack structure, comprising a gate oxide region 61, a polysilicon region 62, a tungsten silicide region 63 and an oxide hard mask layer 64, overlying each of the p-tub 27 (in the NMOS region 7) and the n-tub 40 (in the PMOS region 8).

Figure 5:
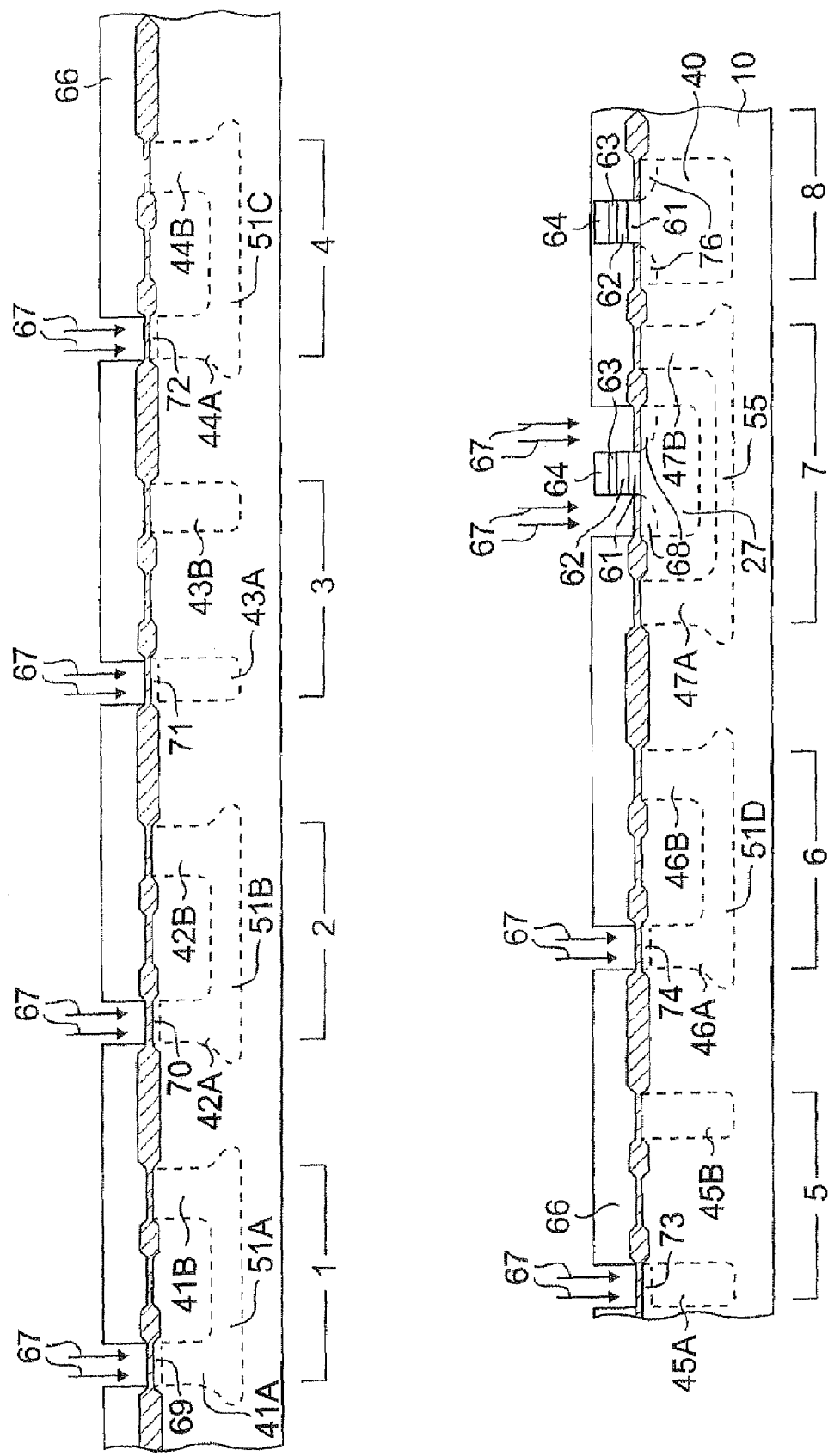

Using a patterned implant mask 66 of FIG. 5, n-type dopants are implanted (as represented by arrowheads 67) to form an n-type lightly doped drain region 68 (NLDD) in the p-tub 27. N-type dopants are also implanted in the BJT regions 1-6 to form n+ collector surface regions 69, 70, 71, 72, 73 and 74, respectively.

Using another appropriately patterned implant mask, not shown in FIG. 5, a p-type lightly doped drain region 76 (PLDD) is formed in the n-tub 40.

Figure 6:
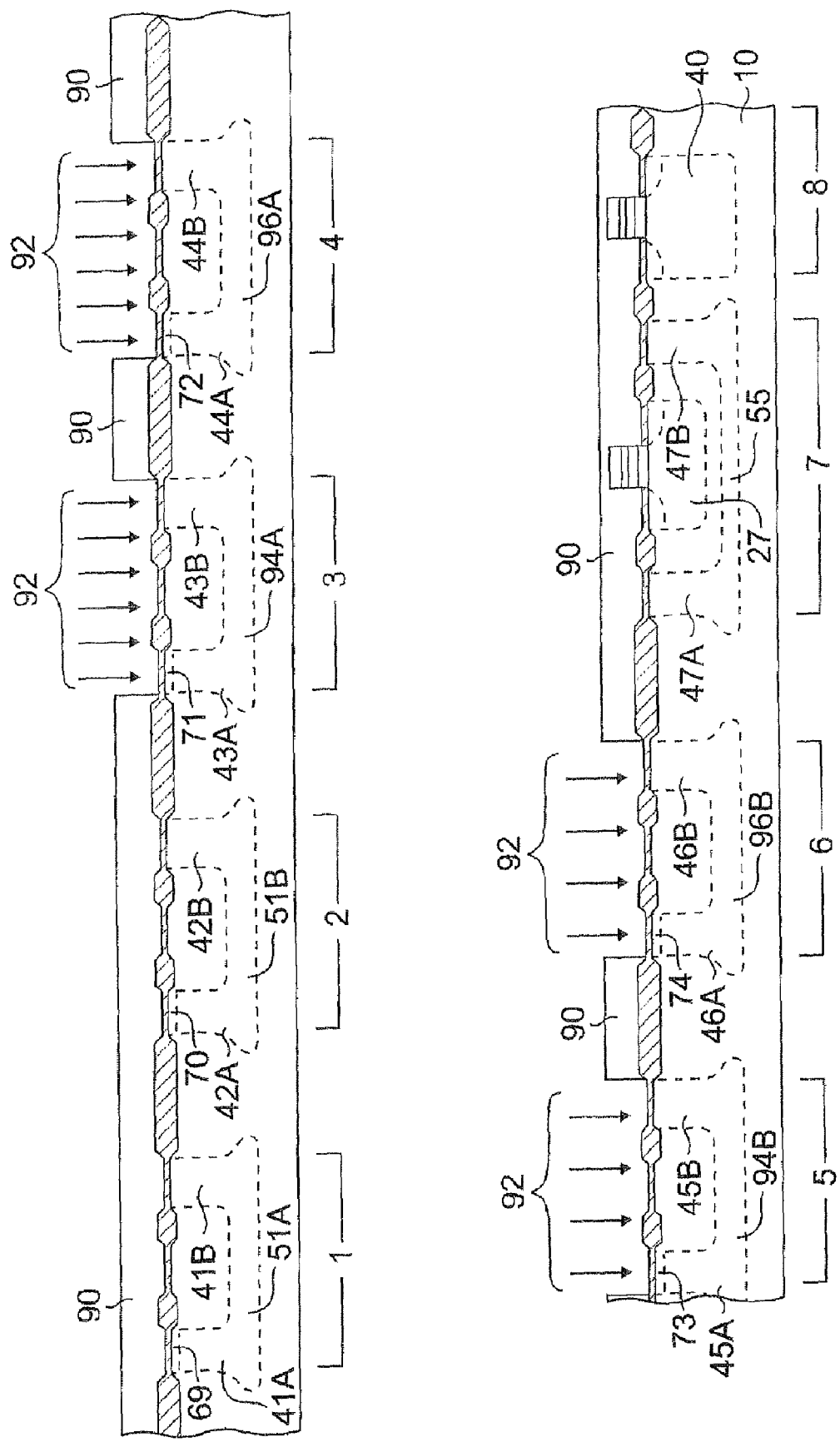

A BJT implant mask 90 is formed overlying the substrate 10 and patterned as illustrated in FIG. 6. N-type implant ions, as represented by arrowheads 92, are implanted during an NPN doping process to modify the dopant concentration of the BJT regions 3-6. In the BJT regions 4 and 6, the NPN doping process adds dopants to the existing dopant concentrations to form subcollector doped regions 96A and 96B, having substantially equal dopant concentrations. In previously undoped regions 3 and 5 (i.e., regions 3 and 5 lacking previous subcollector doping) the NPN implant dose forms subcollector doped regions 94A and 94B having substantially equal dopant concentrations. Since the subcollector doped regions 96A and 96B were previously doped, the dopant concentration of the subcollector doped regions 96A/96B is different from the dopant concentration of the subcollector doped regions 94A/94B.

Since the BJT regions 1 and 2 are masked during the FIG. 6 NPN doping process, these regions retain their dopant concentrations according to the triple well doping process of FIG. 3.

According to a preferred embodiment of the present invention, the FIG. 6 NPN implant dose is greater than the FIG. 3 triple well/subcollector implant dose, resulting in a higher dopant concentration in the subcollector doped regions 94A/94B than in the subcollector doped regions 51A/51B.

At this point in the fabrication process, the formed subcollector regions have one of three different dopant concentrations. The BJT regions 1 and 2 have a first dopant concentration from the triple well/subcollector implant of FIG. 3. The BJT regions 3 and 5 have a second dopant concentration from the NPN doping process of FIG. 6. The BJT regions 4 and 6 have a third dopant concentration from a combination of the triple well/subcollector doping process and the NPN doping process. Since the subcollector doping concentration is directly related to the transistor's breakdown voltages $BV_{CEO}$ and $BV_{CBO}$, BJT's with three different breakdown characteristics have been formed.

A TEOS (tetraethylorthosilicate) silicon dioxide layer 110 and a polysilicon layer 112 are formed overlying the substrate 10. See FIG. 7. The polysilicon layer 112, which will form an extrinsic base region of the BJT's, is doped with a high dose boron implant, not shown.

Next a silicon nitride layer 120 and a silicon dioxide layer 122 (in one embodiment formed according to a TEOS process) are deposited over the polysilicon layer 112. A photoresist layer is deposited and patterned for use in anisotropically etching the silicon dioxide layer 122, the silicon nitride layer 120 and the polysilicon layer 112 to form emitter windows 130 for the BJT's 1-6. The emitter windows 130 stop on the silicon dioxide layer 110.

Figure 7:
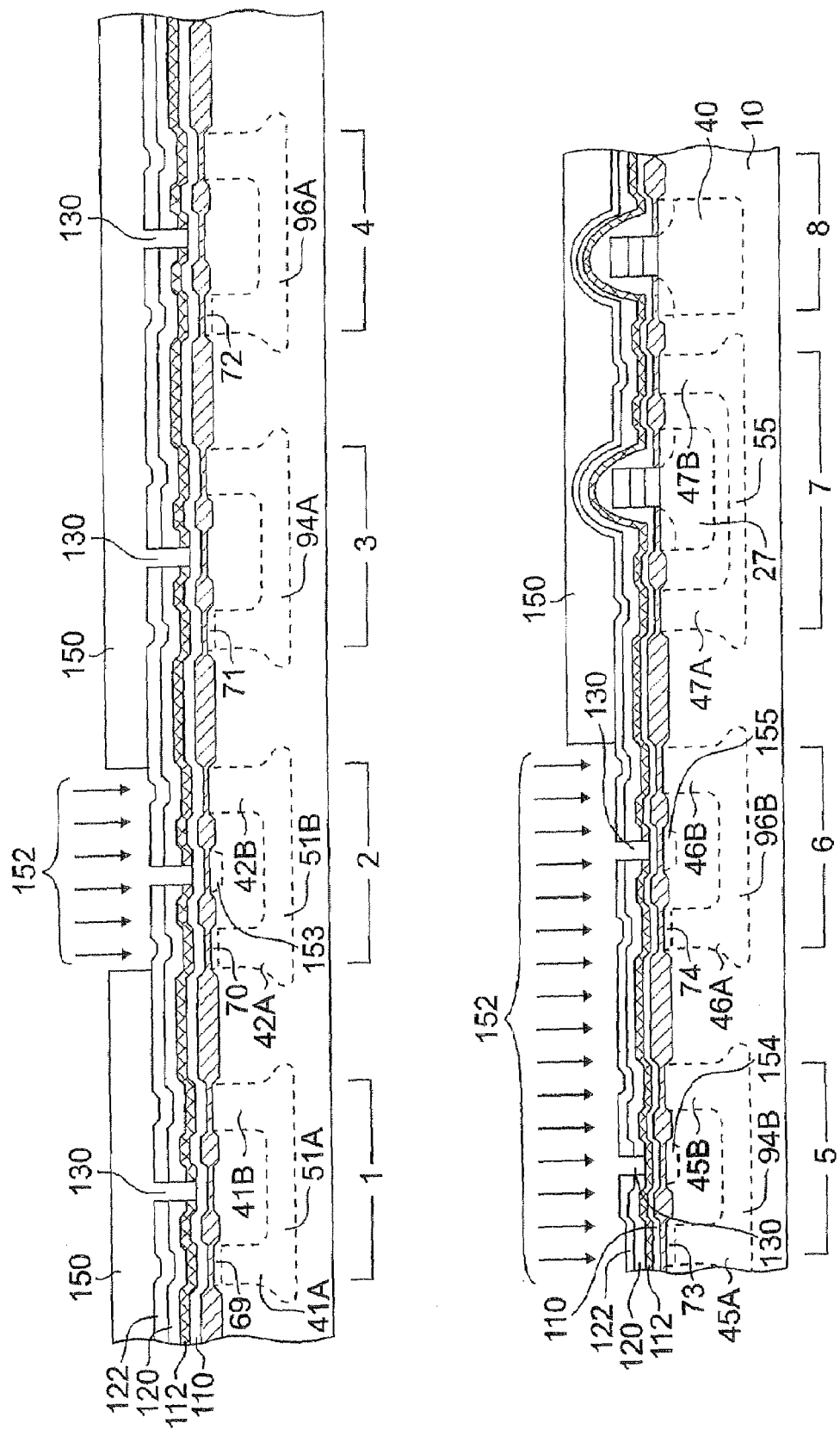

The photoresist layer is removed and a selectively implanted collector (SIC) photoresist layer 150 is formed over the substrate 10 as further illustrated in FIG. 7. As indicated by implant arrowheads 152, n-type dopants are implanted into the exposed BJT regions 2, 5 and 6 immediately below each exposed emitter window 130, forming doped regions 153, 154 and 155 in the BJT regions 2, 5 and 6. The SIC implant does not penetrate through the combined thickness of the silicon dioxide layer 110, the polysilicon layer 112, the silicon nitride layer 120 and the silicon dioxide layer 122.

Since the SIC implant is relatively shallow, the implant dopants penetrate only through the silicon dioxide layer 110 and into a region immediately below the emitter windows 130, forming the SIC doped regions 153 (for the BJT 2), 154 (for the BJT 5) and 155 (for the BJT 6). It is known that the doping concentration at the collector base junction, which is immediately below the silicon dioxide region underlying the emitter window 130, contributes to the transistor breakdown characteristics.

The collector regions of the BJT's 1-6 formed to this point in the process have one of six different dopant concentrations. The collector of the BJT region 1 has a first dopant concentration from the triple well/subcollector implant of FIG. 3. The collector of the BJT region 2 has a second dopant concentration derived from a sum of the triple well/subcollector implant of FIG. 3 and the SIC doping process of FIG. 7. The collector of the BJT region 3 has a third dopant concentration from the NPN doping process of FIG. 6. The collector of the BJT region 4 has a fourth dopant concentration that is a sum of the triple well/subcollector and the NPN doping processes. The collector of the BJT region 5 has a fifth dopant concentration from the NPN doping of FIG. 6 and the SIC implant of FIG. 7. The collector of the BJT region 6 has a sixth dopant concentration from the triple well/subcollector doping process of FIG. 3, the NPN doping process of FIG. 6 and the SIC implant of FIG. 7.

From this point in the process, all of the BJT's 1-6 are exposed to identical fabrication process steps. Thus for the purpose of simplifying the figures and the descriptive text, the subsequent process steps are described for only the BJT region 1.

Figure 8:
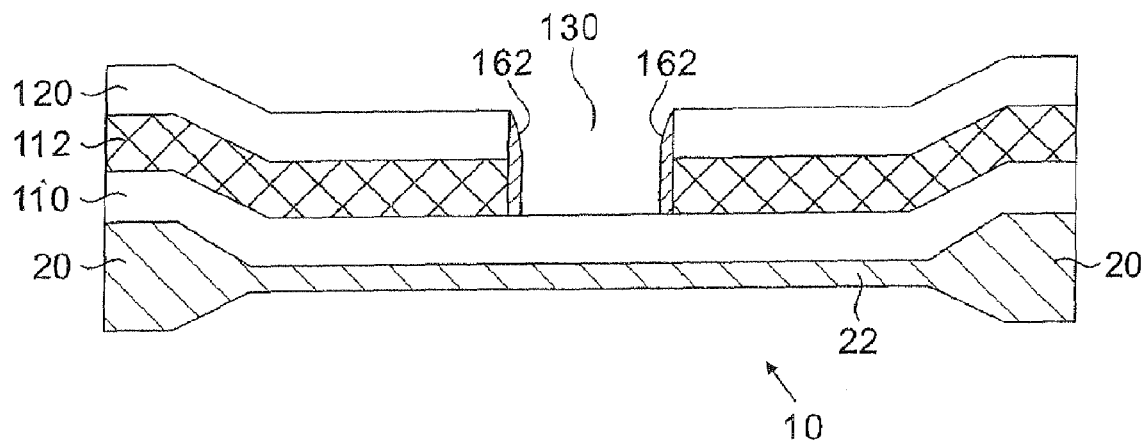
Figure 9:
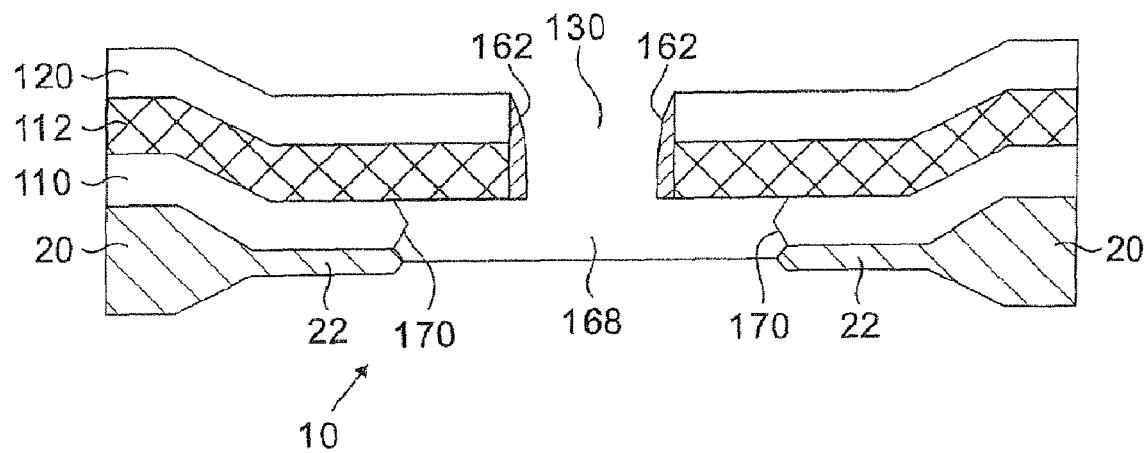
Figure 10:
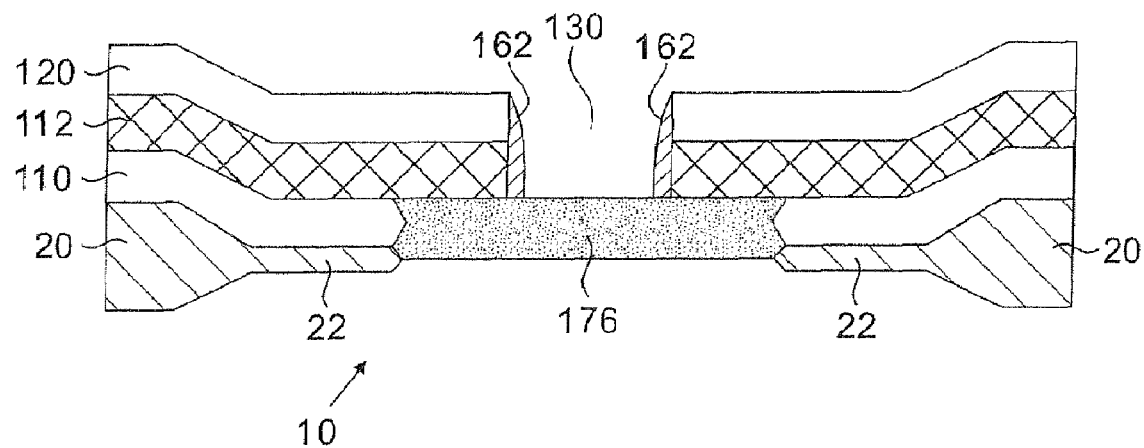

A layer of silicon nitride is deposited overlying the substrate 10 and anisotropically etched to form sidewall spacers 162 within the emitter window 130 as shown in FIG. 8. A wet etch process removes the silicon dioxide layer 110 from within the emitter window 130, forming a cavity 168 and cavities 170 (see FIG. 9) laterally disposed relative to the cavity 168.

An intrinsic base and a cap region, both identified by a reference character 176 (see FIG. 10) are formed in the cavities 168 and 170 during a selective silicon-germanium epitaxial growth step.

Figure 11:
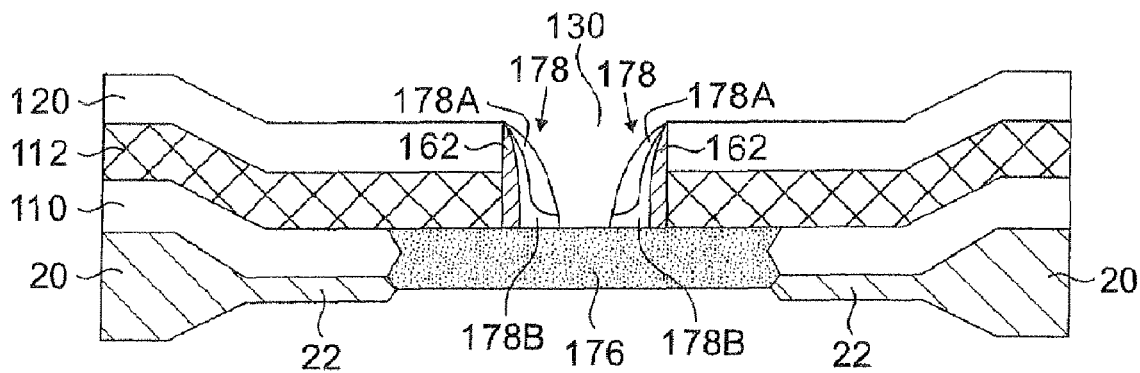

Spacers 178, comprising a silicon nitride layer 178A and an underlying silicon dioxide layer 178B, are formed over the spacers 162, as illustrated in FIG. 11. The spacers 178, which increase the distance between a later-formed n+ emitter and a p+ extrinsic base in the window 130, are formed by depositing and anisotropically etching a TEOS silicon dioxide layer and a silicon nitride layer. In another embodiment, the spacers 178 may not be required as the previously-formed spacers 162 are sufficient to provide the necessary separation between the emitter and extrinsic base.

Figure 12:
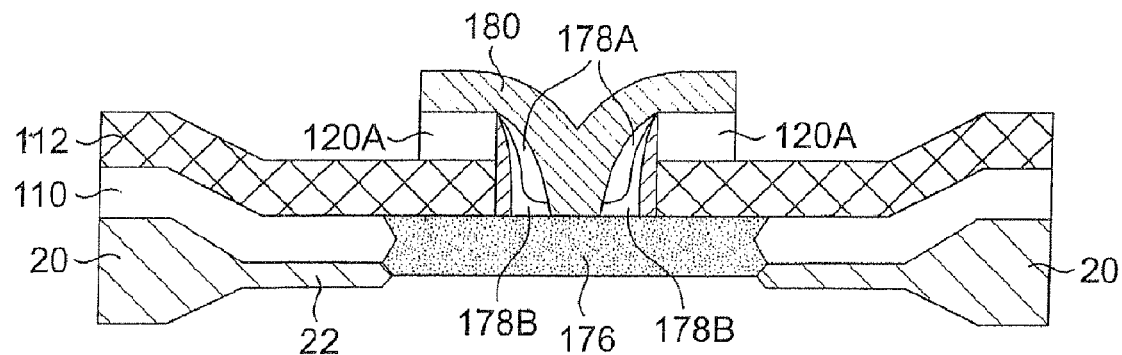
Figure 13:
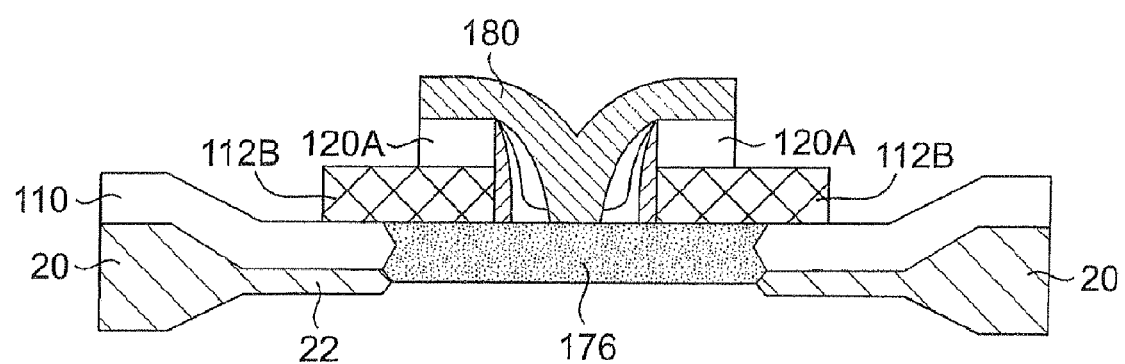
Figure 14:
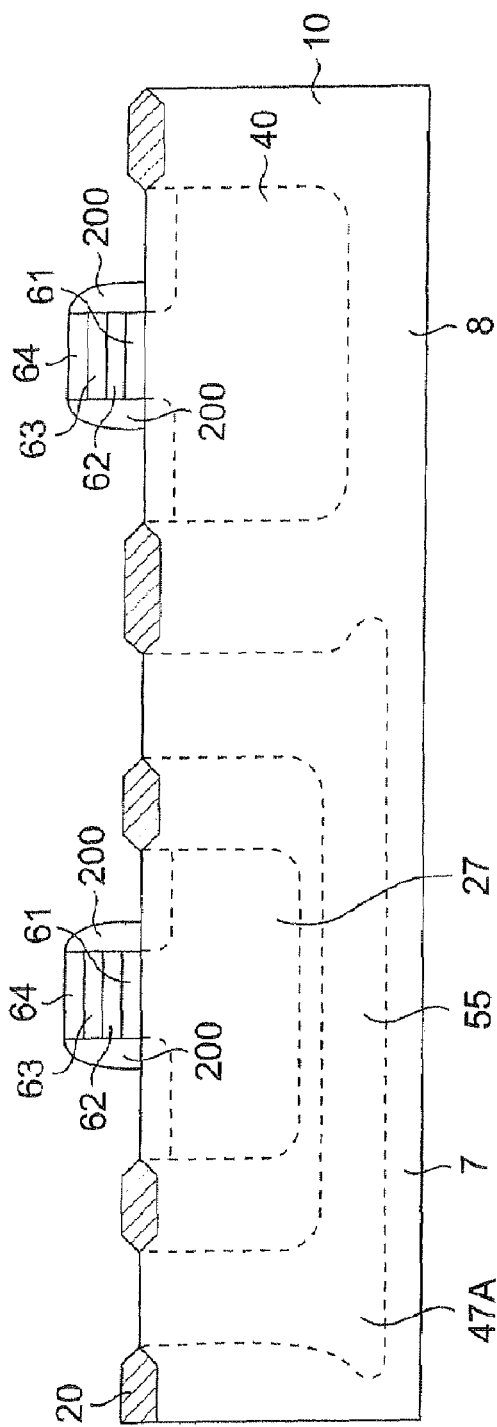

To form an emitter 180 of FIG. 12, a polysilicon layer is deposited (including deposition within the emitter window 130) and doped n-type by implant or in-situ doping. A hard mask and photoresist mask are utilized to pattern the doped polysilicon layer to form the emitter 180. Regions of the silicon nitride layer 120 are also removed during the emitter region etch, leaving silicon nitride regions 120A underlying the emitter region 180. Using another photoresist mask, the polysilicon layer 112 is etched to form an extrinsic base 112B as shown in FIG. 13.

At this point processing of the BJT's is essentially complete; each BJT comprises the intrinsic base 176, the extrinsic base 112B (formed from doped polysilicon), the emitter 180 (formed from doped polysilicon) the collector regions as follows: for the BJT region 1 the collector region comprises the tubs 41A and 41B and the triple well 51A; for the BJT region 2 the collector regions comprises the tubs 42A and 42B, the triple well 51B and the SIC doped region 153; for the BJT region 3 the collector region comprises the tubs 43A and 43B and doped region 94A; for the BJT region 4 the collector region comprises the tubs 44A and 44B and the doped region 96A (further comprising the triple well 51C plus dopants added by the doping process illustrated in FIG. 6); for the BJT region 5 the collector region comprises the tubs 45A and 45B, the doped region 94B and the SIC doped region 154 and for the BJT region 6 the collector region comprises the tubs 46A and 46B and the doped region 96B (further comprising the triple well 51D plus dopants added by the doping process of FIG. 6) and the SIC doped region 155. The collector region of each of the BJT's regions 1-6 further comprises the collector surface regions 69-74, respectively, as shown in FIG. 7.

Figure 15:
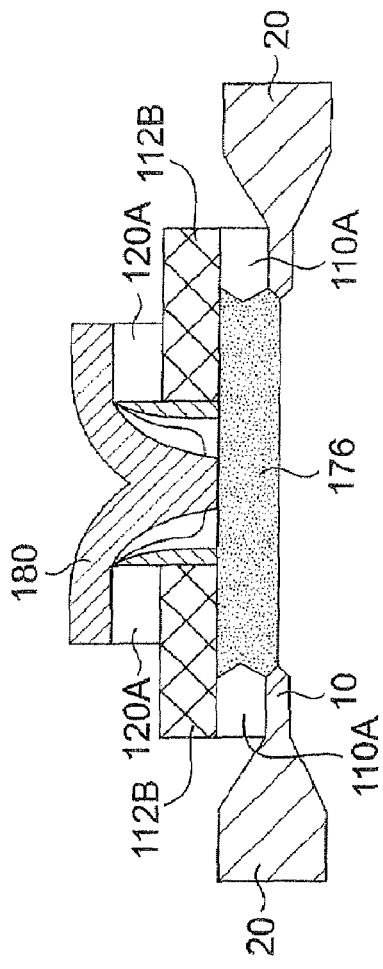

Continuing with formation of the MOSFETS, during an anisotropic etch step, the silicon dioxide layer 110 is etched to form spacers 200 (see FIG. 14, which depicts a partial view of the substrate 10, illustrating only the NMOSFET 7 and the PMOSFET 8) adjacent the gate stacks, each gate stack comprising the gate oxide region 61, the polysilicon region 62, the tungsten silicide region 64 and the hard mask region 64. This etch step also removes the silicon dioxide layer 110 from the BJT regions 1-6, forming silicon dioxide regions 110A. FIG. 15 illustrates the resulting structure for the exemplary BJT region 1.

Figure 16:
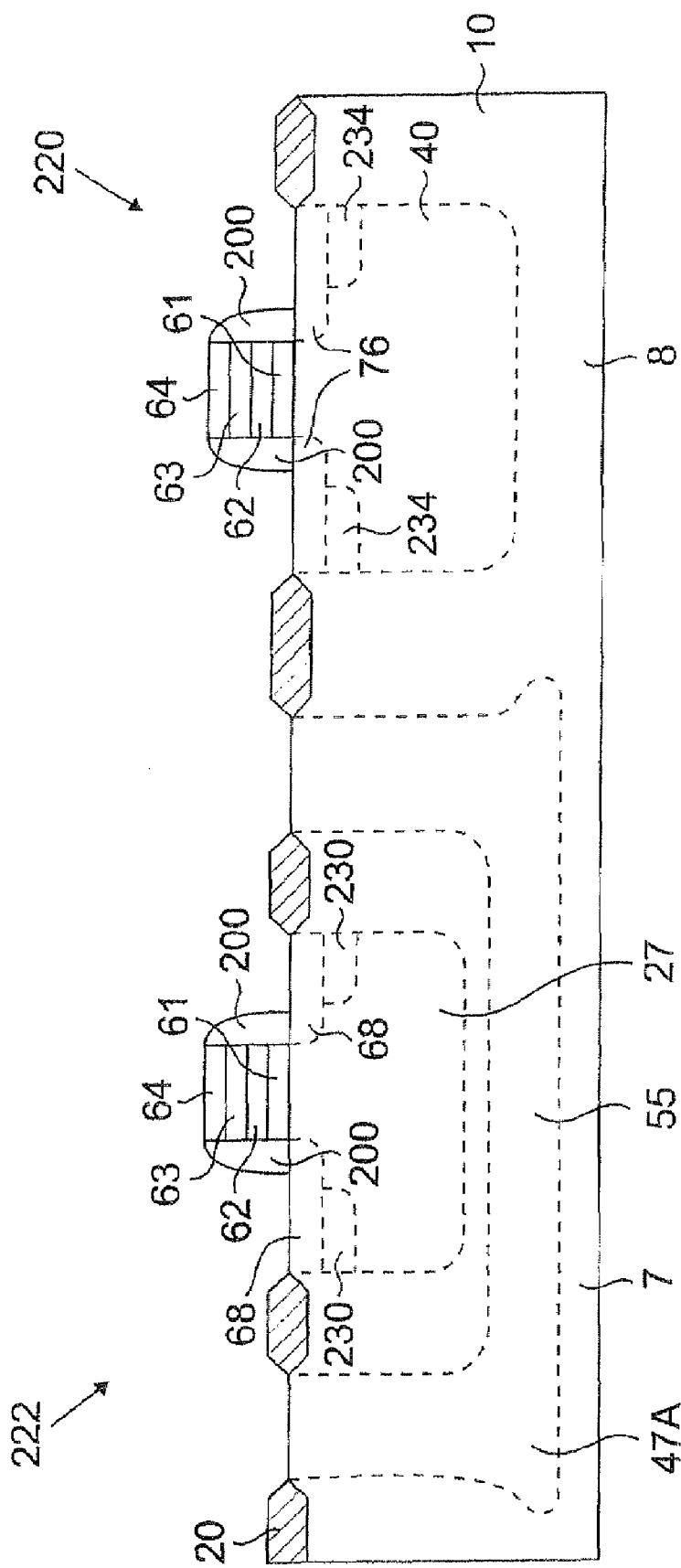

Conventional processing steps are executed for completing fabrication of a PMOSFET 220 and an NMOSFET 222 illustrated in FIG. 16, including implanting source/drain regions 230 in the p-tub 27 (for the NMOSFET 222) and source/drain regions 234 in the n-tub 40 for the PMOSFET 220. After forming contact regions for the doped regions of the BJT's 1-6, the PMOSFET 220 and the NMOSFET 222, an interconnect structure, comprising alternating dielectric and conductive layers, is formed over the substrate 10 according to known processes. Windows are defined in a first dielectric layer and conductive plugs formed therein for establishing electrical contact with contact regions of the BJT's 1-6, the PMOSFET 220 and the NMOSFET 222. Interconnect structures for connecting the regions are formed in a first metallization layer. Additional alternating dielectric layers and interconnect layers are formed over the first metallization layer to complete the interconnect system of the integrated circuit. Interconnect structures can be formed by conventional metal deposition and subtractive etching processes or by damascene processes.

Exemplary implant values to produce the various BJT doped regions as described herein are set forth below:

for the triple well implant described in conjunction with FIG. 3: phosphorous at about 1000 keV and a dose of about 2E13 per cubic cm;

for the NPN implant described in conjunction with FIG. 6: phosphorous at about 900 keV and a dose of about 5E14 per cubic cm;

for the SIC implant described in conjunction with FIG. 7: phosphorous at about 500 keV and a dose of about 1.3E13 per cubic cm and phosphorous at about 190 keV and a dose of about 4E12 per cubic cm. In certain embodiments, both SIC implants are used to establish the breakdown effects described above.

Figure 17:
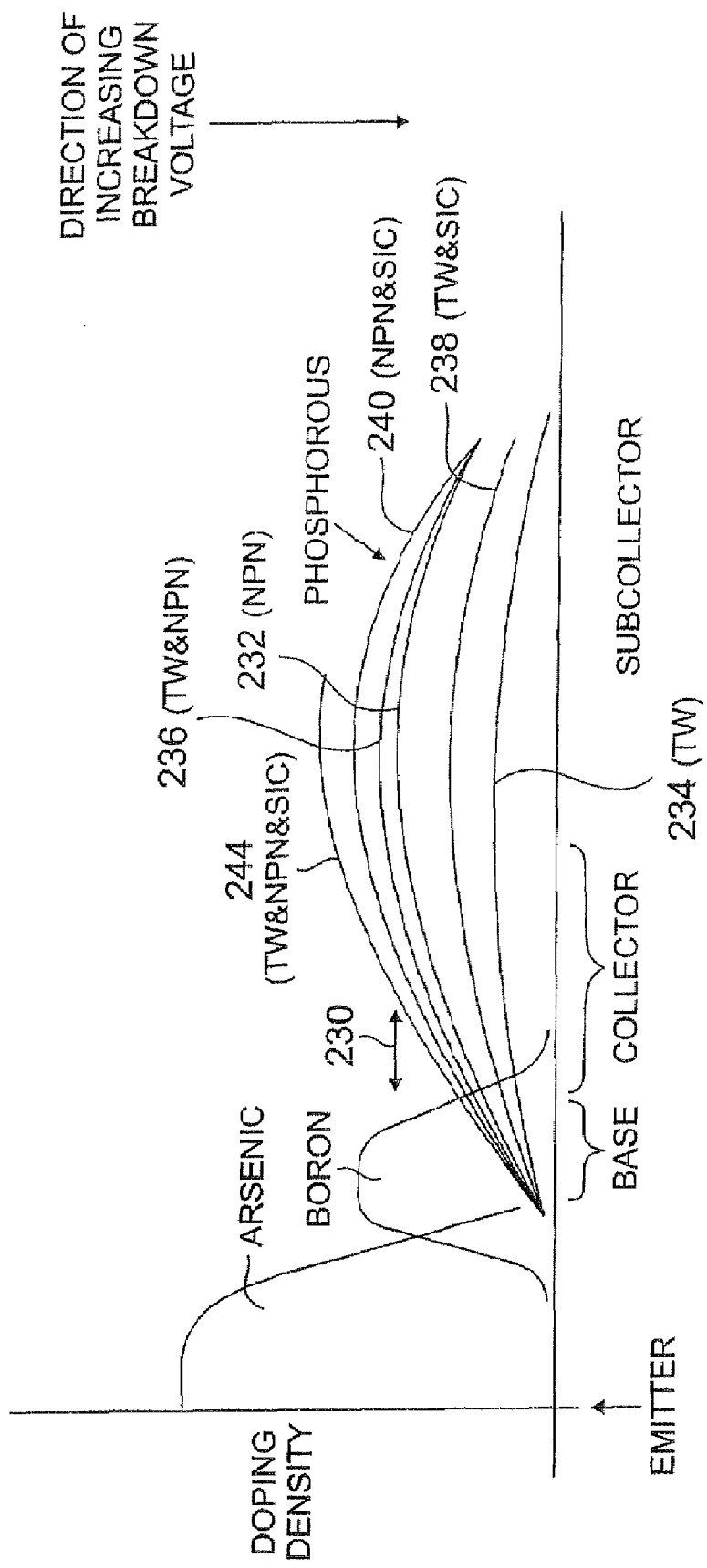
FIG. 17 is a graph illustrating an approximate doping density for a bipolar junction transistor constructed according to the teachings of the present invention.

FIG. 17 illustrates an exemplary relative doping profile as a function of depth for the BJT's 1-6. The BJT doped regions and the typical dopant for each region are indicated in FIG. 17. An arrowhead 230 identifies a region (of about 1-2 microns in depth) in the collector where the doping level primarily determines the breakdown voltage $BV_{CEO}$ and $BV_{CBO}$ of the BJT.

A dopant density 232 represents the dopant density generally in the subcollector of the BJT region 3 as formed by the NPN doping process of FIG. 6. A dopant density 234 in the BJT region 1 results from the triple well/subcollector doping process of FIG. 3. A dopant density 236 represents the dopant density for the BJT region 4 that has been subjected to both the NPN and the triple well/subcollector doping processes. A dopant density 238 in the BJT region 2 represents the dopant density in the collector region as formed by the triple well/subcollector doping process of FIG. 3 and the SIC doping process of FIG. 7. A dopant density 240 in the BJT region 5 results from the NPN and the SIC doping processes. A dopant density 244 represents the dopant density for the BJT region 6 that has been subjected to the NPN, triple well/subcollector and SIC doping processes. Since each of the BJT regions 1-6 has a different collector doping density, each exhibits a different breakdown voltages, where a higher dopant density produces a higher breakdown voltage. Table 1 below summarizes the dopant densities of the BJT regions 1-6.

TABLE 1

| BJT REGION | DOPANT DENSITY DERIVED FROM |
|---|---|
| 1 | Triple well/subcollector doping of FIG. 3 |
| 2 | Triple well/subcollector doping plus SIC doping of FIG. 7 |
| 3 | NPN doping of FIG. 6 |
| 4 | Triple well/subcollector doping plus NPN doping |
| 5 | NPN doping plus SIC doping |
| 6 | Triple well/subcollector doping plus NPN doping plus SIC doping |

The teachings of the present invention can also be applied to BJT's fabricated from a single polysilicon layer. In this embodiment, a base region is formed in the substrate overlying the collector region. The emitter is formed from the polysilicon layer deposited within the emitter window as described above. The teachings can also be applied to transistor structures where the subcollector is not implanted (i.e., a relatively shallow subcollector implant and a relatively thick silicon epitaxial layer formed before any other processing steps are executed). Further, the teachings can be applied to a transistor having only implanted regions or junctions (i.e., without using polysilicon layers to form the transistor regions).

An architecture and process have been described as useful for forming bipolar junction transistors in a semiconductor substrate. Specific applications and exemplary embodiments of the invention have been illustrated and discussed, and provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A process for forming bipolar junction transistors in a semiconductor substrate, the process comprising:
   forming first doped tub regions of a first dopant type within the substrate in a first metal oxide semiconductor field effect transistor (MOSFET) regions of the substrate;
   concurrently forming doped sinker regions of a second dopant type, opposite in type to the first dopant type, within first, second, third and fourth bipolar junction transistor (BJT) regions in the substrate and forming second doped tub regions with the second dopant type in second MOSFET regions;
   concurrently forming subcollector regions within the first, second and fourth BJT regions and forming triple well regions within the first MOSFET regions all with the second dopant type, wherein the triple well regions and the second doped tub regions cooperate to electrically isolate the first doped tub regions of the first MOSFET regions from the substrate, and wherein each one of the subcollector regions cooperate with respective doped sinker regions in the first, second and fourth BJT regions;
   forming gate electrodes over triple wells in the first MOSFET regions and over the second doped tub regions in the second MOSFET regions;
   concurrently doping unmasked portions of the doped sinker regions in the first, second, third and fourth BJT regions and the first doped tub regions with the second type dopant, including forming source/drain regions adjacent the gate electrodes in the first MOSFET regions; and
   doping the third and fourth BJT regions with the second dopant type to form a subcollector in the third BJT region and further doping the subcollector in the fourth BJT region.

2. The process of claim 1 further including:
   forming a bipolar junction transistor structure for cooperating with the doped sinker regions and the subcollector region in the first BJT region to form a first bipolar junction transistor in the first BJT region;
   forming a bipolar junction transistor structure for cooperating with the doped sinker regions and the subcollector region in the second BJT region to form a second bipolar junction transistor in the second BJT region;
   forming a bipolar junction transistor structure for cooperating with the doped sinker regions and the subcollector region in the third BJT region to form a third bipolar junction transistor in the third BJT region; and
   forming a bipolar junction transistor structure for cooperating with the fourth doped sinker region and the fourth subcollector region to form a fourth bipolar junction transistor;
   wherein the first, second, third and fourth bipolar junction transistors exhibit breakdown characteristics in the following order beginning with the bipolar junction transistor having the highest breakdown voltage, the first bipolar junction transistor, the third bipolar junction transistor, the second bipolar junction transistor and the fourth bipolar junction transistor.

3. The process of claim 1 wherein forming the gate electrodes occurs after concurrently forming the first, second, and fourth subcollector regions and the triple well regions.

4. The process of claim 3 wherein forming the gate electrodes occurs prior to forming a subcollector in the third BJT region and further doping the subcollector in the fourth BJT region.

5. The process of claim 1 wherein concurrently forming subcollectors in the first, second, third, and fourth BJT regions and the triple wells in the MOSFET regions comprise using an n-type dopant.

6. The process of claim 5 wherein doping to form the subcollector regions and the triple well regions further comprise implanting phosphorous at a dose of about 2E13 per cubic cm.

7. The process of claim 1 further comprising forming material layers overlying the substrate and forming emitter windows within one or more of the material layers in the first, second, third and fourth BJT regions after forming the subcollectors in the first, second, third and fourth BJT regions.

* * * * *